(12) United States Patent
Kim et al.

(10) Patent No.: US 10,497,700 B2
(45) Date of Patent: Dec. 3, 2019

(54) ANTI-FUSE FOR USE IN SEMICONDUCTOR DEVICE

(71) Applicants: SK hynix Inc., Gyeonggi-do (KR); INDUSTRY-ACADEMIA COOPERATION GROUP OF SEJONG UNIVERSITY, Seoul (KR)

(72) Inventors: Deok-kee Kim, Seoul (KR); Honggyun Kim, Seoul (KR); Jae Hong Kim, Gyeonggi-do (KR); Seo Woo Nam, Gyeonggi-do (KR)

(73) Assignees: SK hynix Inc., Gyeonggi-do (KR); INDUSTRY-ACADEMIA COOPERATION GROUP OF SEJONG UNIVERSITY, Seoul (KR)

( * ) Notice: Subject to any disclaimer, the term of this patent is extended or adjusted under 35 U.S.C. 154(b) by 0 days.

(21) Appl. No.: 15/896,700

(22) Filed: Feb. 14, 2018

(65) Prior Publication Data

US 2019/0088647 A1    Mar. 21, 2019

(30) Foreign Application Priority Data

Sep. 18, 2017  (KR) .................. 10-2017-0119314

(51) Int. Cl.
*H01L 27/00* (2006.01)
*H01L 27/07* (2006.01)
*H01L 23/532* (2006.01)
*H01L 23/525* (2006.01)

(52) U.S. Cl.
CPC ...... *H01L 27/0738* (2013.01); *H01L 23/5252* (2013.01); *H01L 23/53295* (2013.01)

(58) Field of Classification Search
CPC .......... H01L 23/5252; H01L 23/53295; H01L 23/5229; H01L 23/49827; H01L 27/0738; H01L 27/11206; H01L 27/11; H01L 27/092

See application file for complete search history.

(56) References Cited

U.S. PATENT DOCUMENTS

| 7,030,458 | B2 * | 4/2006 | Marr ..................... G11C 17/16 257/529 |
| 7,323,761 | B2 * | 1/2008 | Park .................... H01L 23/5252 257/530 |
| 7,723,820 | B2 * | 5/2010 | Kim ..................... H01L 23/5252 257/528 |
| 9,431,497 | B2 * | 8/2016 | Toh ................... H01L 27/11206 |
| 2004/0065941 | A1 * | 4/2004 | Marr ..................... G11C 17/16 257/530 |
| 2006/0102982 | A1 * | 5/2006 | Park .................... H01L 23/5252 257/528 |

(Continued)

FOREIGN PATENT DOCUMENTS

| KR | 1020140117907 | 10/2014 |
| KR | 101605749 | 3/2016 |
| KR | 1020160068212 | 6/2016 |

*Primary Examiner* — Nikolay K Yushin
(74) *Attorney, Agent, or Firm* — IP & T Group LLP (57) ABSTRACT

An anti-fuse for a semiconductor device includes an electrode; a gate metal formed to extend from the electrode; a gate oxide layer formed under the gate metal; a semiconductor layer formed under the gate oxide layer to overlap with a center portion of the gate metal; and a first oxide layer formed under the gate metal and the gate oxide layer and on both sides of the semiconductor layer.

18 Claims, 6 Drawing Sheets

(56) References Cited

U.S. PATENT DOCUMENTS

2008/0157125 A1\* 7/2008 Kim .................... H01L 23/5252
257/209
2014/0346603 A1\* 11/2014 Toh ................... H01L 27/11206
257/350

\* cited by examiner

FIG.12

ANTI-FUSE FOR USE IN SEMICONDUCTOR DEVICE

CROSS-REFERENCES TO RELATED APPLICATION

The present application claims priority under 35 U.S.C. § 119(a) to Korean application number 10-2017-0119314, filed on Sep. 18, 2017, in the Korean Intellectual Property Office, which is incorporated herein by reference in its entirety.

BACKGROUND

1. Technical Field

Various embodiments generally relate to an anti-fuse for use in a semiconductor device and a semiconductor device comprising the same.

2. Related Art

In general, semiconductor device fuses are used to achieve various purposes in the field of semiconductor technology. For example, fuses may be used in a repair process in which a failed memory cell is replaced with a redundancy memory cell, and may be used in a constant voltage generation circuit which tunes a voltage or a control circuit for selecting various modes and testing.

Such fuses may be divided into e-fuses and anti-fuses depending on a resistance change. Between them, an anti-fuse may be broken down by using the potential difference of both ends of an oxide layer. Meanwhile, one of the requirements for improved fuse technology is to reduce the fuse area. In this regard, since a selection element provides program current and occupies most of the fuse area, it may be required a technique for lowering program current affecting the size of the selection element to thereby reduce the fuse area.

SUMMARY

Various embodiments are directed to an anti-fuse for a semiconductor device capable of being broken down with a low program voltage, thereby improving performance and reducing a fuse area.

In an embodiment, an anti-fuse for use in a semiconductor device may include: an electrode; a gate metal formed to extend from the electrode; a gate oxide layer formed under the gate metal; a semiconductor layer formed under the gate oxide layer to overlap with a center portion of the gate metal; and a first oxide layer formed under the gate metal and the gate oxide layer and on both sides of the semiconductor layer.

In an embodiment, an anti-fuse for use in a semiconductor device may include: a gate metal formed to extend from an electrode; a semiconductor layer formed under a center portion of the gate metal; a gate oxide layer formed between the gate metal and the semiconductor layer; and a first oxide layer formed under the gate metal and the gate oxide layer and on both sides of the semiconductor layer, wherein the gate metal includes a first gate metal extending from the electrode, and a second gate metal extending by being contact with one end of the first gate metal and is formed of a metal different from the first gate metal.

In an embodiment, a semiconductor device comprising at least one anti-fuse, the anti-fuse comprising: an electrode; a gate metal formed to extend from the electrode; a gate oxide layer formed under the gate metal; a semiconductor layer formed under the gate oxide layer to overlap with a center portion of the gate metal; and a first oxide layer formed under the gate metal and the gate oxide layer and on both sides of the semiconductor layer.

According to the embodiments, it is possible to break down the gate oxide layer by applying a relatively low program voltage.

Further, since the gate oxide layer may be broken down with a low program voltage, it is possible to reduce an area per bit of an anti-fuse.

DETAILED DESCRIPTION

Hereinafter, various embodiments will be described in detail with reference to the accompanying drawings to the extent that a person skilled in the art to which the embodiments pertain may easily enforce the embodiments. Among the reference numerals presented in the drawings, like reference numerals denote like members.

In describing the present disclosure, when it is determined that the detailed description of the known related art may obscure the gist of the present disclosure, the detailed description thereof will be omitted.

Although the terms such as first and second may be used to describe various components, the components are not limited by the terms, and the terms are used only to distinguish components from other components.

In the following embodiments, an n-type metal may be defined as a metal which is used in an NMOS (n-type metal oxide semiconductor) transistor, and a p-type metal may be defined as a metal which is used in a PMOS (p-type metal oxide semiconductor) transistor.

Figure 1:
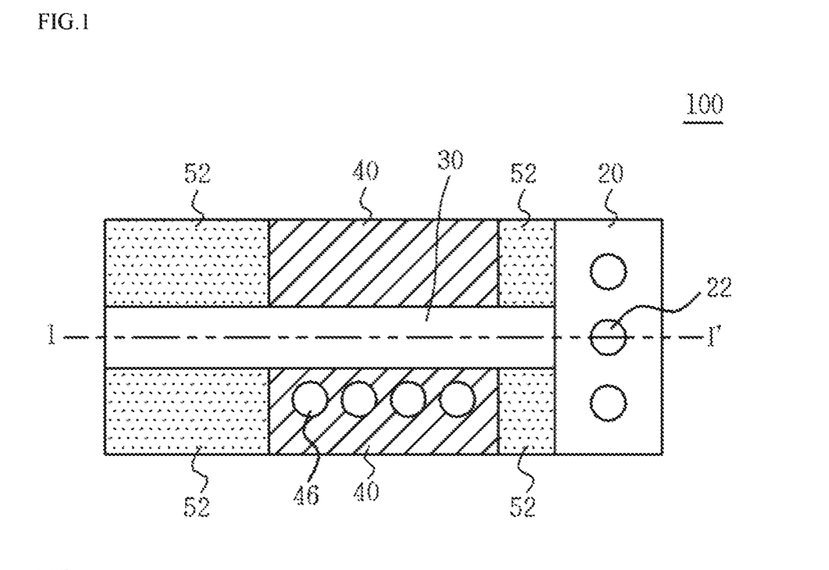
FIG. 1 is a top view to assist in the explanation of an anti-fuse for a semiconductor device in accordance with a first embodiment of the present disclosure.

FIG. 1 is a top view to assist in the explanation of an anti-fuse for a semiconductor device in accordance with a first embodiment of the present disclosure.

Referring to FIG. 1, an anti-fuse 100 for a semiconductor device includes an electrode 20, a gate metal 30, a semiconductor layer 40, and a first oxide layer 52.

A program voltage is applied to the electrode 20 in programming. More specifically, programming may include applying the program voltage to the electrode 20 and applying a ground voltage to the semiconductor layer 40. Contacts 22 for applying the program voltage to the electrode 20 may be formed on the electrode 20.

The gate metal 30 may have a shape of an elongated bar extending in a first direction I-I' from the electrode 20 to which the program voltage is applied. The gate metal 30 is formed of a material capable of being electrically programmed. For instance, the gate metal 30 may be formed of an n-type metal which is used for an NMOS transistor or a p-type metal which is used for a PMOS transistor. The gate metal 30 may be formed of a metallic material such as Al or may be formed of layers of TIN, Ti, Al and AlTiO. The gate metal 30 may be formed integrally with the electrode 20. The gate electrode 20 may have the shape of an elongated bar extending in a second direction II-II'. The second direction may be perpendicular to the first direction I-I'.

The semiconductor layer 40 is formed under a center portion of the gate metal 30 with a gate oxide layer disposed therebetween. The semiconductor layer 40 may have a smaller length in the first direction I-I' than the gate metal 30. The semiconductor layer 40 and the gate metal 30 may be formed in an n-type or a p-type transistor. In programming, the program voltage may be applied to the electrode 20, and the ground voltage may be applied to the semiconductor layer 40. One or more contacts 46 for applying the ground voltage to the semiconductor layer 40 may be formed on the semiconductor layer 40.

The first oxide layer 52 may be formed on both sides of the semiconductor layer 40 and at the same level as the semiconductor layer 40. The gate oxide layer 60 (see FIG. 2) is formed between the first oxide layer 52 and the gate metal 30. The gate oxide layer 60 is formed to be brought into contact with the top ends of the semiconductor layer 40 and the first oxide layer 52 at a position corresponding to the bottom end of the gate metal 30. The gate oxide layer 60 may react with the gate metal 30 or be changed in its dielectric constant characteristic due to a high temperature when the program voltage is applied to the electrode 20.

In the anti-fuse 100 configured as mentioned above, when a program voltage is applied to the electrode 20 and the ground voltage is applied to the semiconductor layer 40, a breakdown may be induced in the gate oxide layer 60.

In the anti-fuse 100 of a semiconductor device, if a voltage is applied to the gate metal 30 and the semiconductor layer 40 by the program voltage, high potential may be applied to the gate oxide layer 60 between the gate metal 30 and the semiconductor layer 40, and thus, a breakdown phenomenon may be induced. While it is illustrated in FIG. 1 that the gate metal 30 has the same sectional area and extends from the electrode 20 in one direction, this is only for the sake of convenience in explanation, and it is to be noted that the embodiment is not limited thereto. For example, the gate metal 30 may include a bent portion, and/or may be formed to have a different sectional area. The bent portion or the variable sectional area may have an advantage of enabling the blowing of the gate metal 30 by a lower program current.

If the gate oxide layer 60 is broken down, the value of the capacitance between the gate metal 30 and the semiconductor layer 40 may change significantly before and after the programming.

In the present embodiment, the performance of the anti-fuse 100 may be improved since a high on/off ratio is possible due to the significant changes, and an area per bit of the anti-fuse 100 may be reduced since the program is possible with low current.

Figure 2:
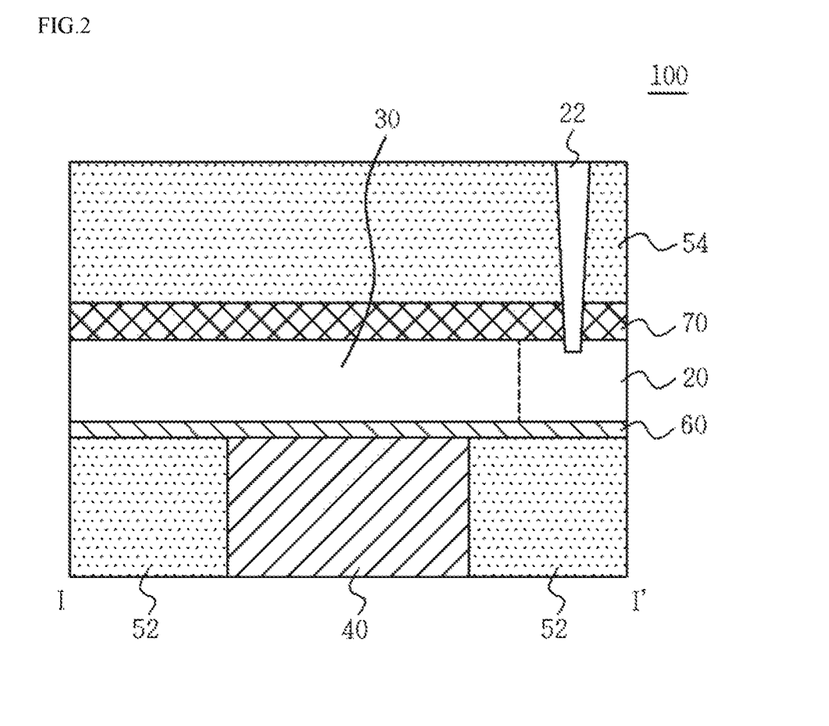
FIG. 2 is a cross-sectional view taken along the line I-I' of FIG. 1.

A silicon nitride layer 70 and a second oxide layer 54 shown in FIG. 2 are not shown in the top view of FIG. 1 to facilitate the understanding of the structure of the present embodiment. As shown in FIG. 2, the silicon nitride layer 70 may be formed on the gate metal 30 and the electrode 20, and the second oxide layer 54 may be formed on the silicon nitride layer 70, the semiconductor layer 40 and the first oxide layer 52.

FIG. 2 is a cross-sectional view taken along the line I-I' of FIG. 1.

Referring to FIG. 2, the anti-fuse 100 of a semiconductor device includes the semiconductor layer 40 which is formed under the center portion of the gate metal 30, the first oxide layer 52 which is formed on both sides of the semiconductor layer 40 under the gate oxide layer 60 and positioned centrally under the gate metal 30 and the electrode 20, and the gate metal 30 which is formed on the gate oxide layer 60 and extends over the semiconductor layer 40 and the first oxide layer 52 from the electrode 20.

The gate oxide layer 60 is formed under the gate metal 30. The gate oxide layer 60 is formed to be brought into contact with the top ends of the semiconductor layer 40 and the first oxide layer 52 corresponding to the bottom end of the gate metal 30. The gate oxide layer 60 may be broken down due to the high voltages of both ends thereof during programming. For instance, the gate oxide layer 60 may be formed of $HfO_2$.

The silicon nitride layer 70 may be formed on the gate metal 30, and the second oxide layer 54 is formed on the silicon nitride layer 70. For instance, the silicon nitride layer 70 may be formed of SiN or SiCN. The contacts 22 for applying the program voltage to the electrode 20 may be formed in the silicon nitride layer 70 and the second oxide layer 54 corresponding to the top of the electrode 20.

Figure 3:
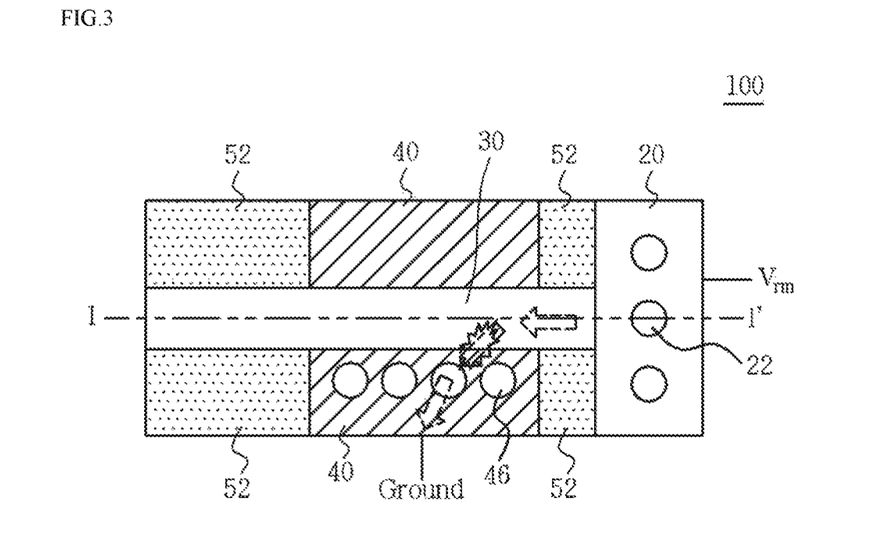
FIGS. 3 and 4 are a view and a graph to assist in the explanation of the change of capacitance when programming the anti-fuse.
Figure 4:
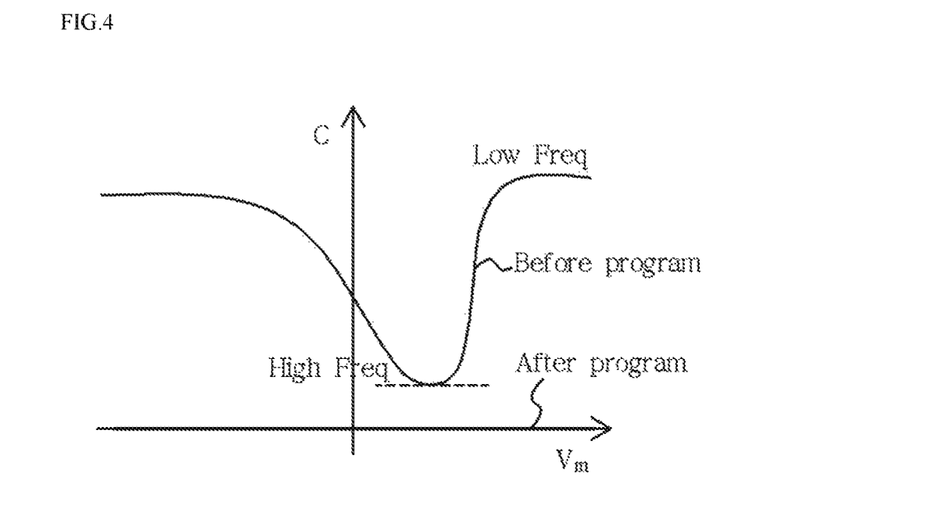

FIGS. 3 and 4 are a view and a graph to assist in the explanation of the change of capacitance when programming the anti-fuse. For instance, FIGS. 3 and 4 exemplify a case where the gate metal 30 and the semiconductor layer 40 are formed in an NMOS type, and the program voltage is applied to the electrode 20 and the ground voltage is applied to the semiconductor layer 40.

Referring to FIGS. 3 and 4, in the anti-fuse 100 of a semiconductor device, when a program voltage is applied to the electrode 20 and the ground voltage is applied to the semiconductor layer 40, the breakdown phenomenon is induced in the gate oxide layer 60 due to the high voltages of both ends thereof. As a result, the value of the capacitance between the gate metal 30 and the semiconductor layer 40 shows a large difference before and after the programming.

In the programming of the anti-fuse 100, if the gate oxide layer 60 is broken down by the excessive voltages in the program, since the anti-fuse 100 does not properly perform an insulation function, the value of the capacitance decreases.

In this way, the capacitance value of the anti-fuse 100 changes depending on whether or not the anti-fuse is programmed.

Figure 5:
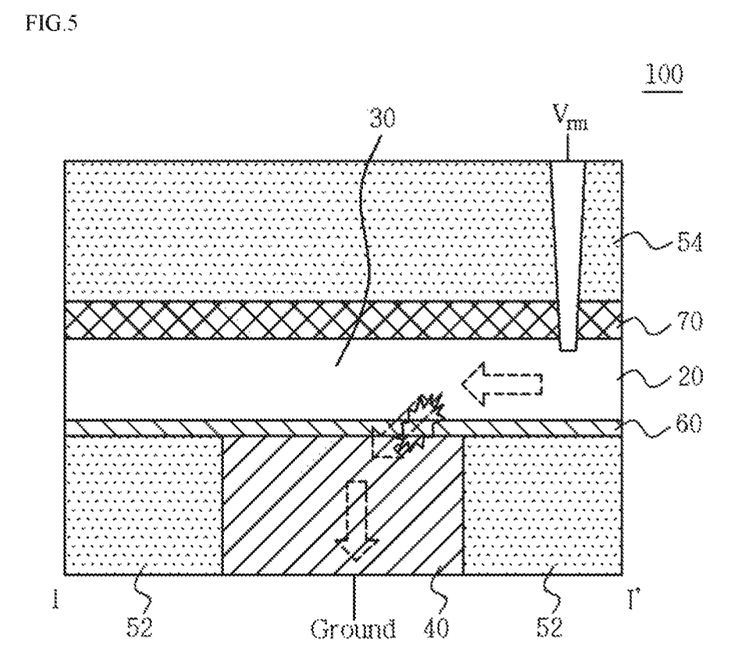
FIGS. 5 and 6 are a view and a graph to assist in the explanation of leakage current according to the programming of the anti-fuse.
Figure 6:
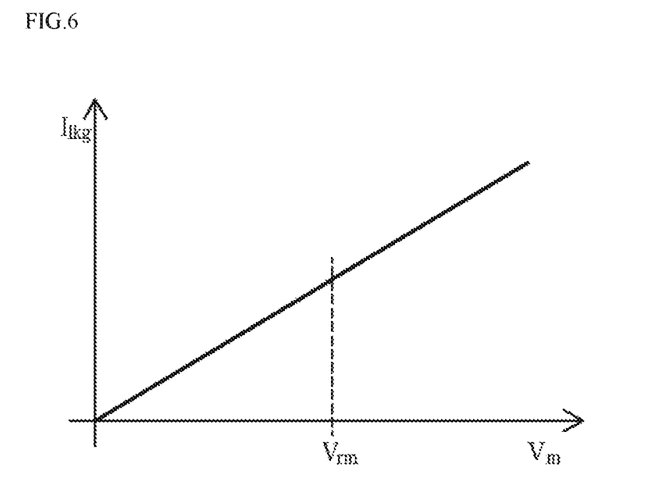

FIGS. 5 and 6 are a view and a graph to assist in the explanation of leakage current according to the programming of the anti-fuse.

Referring to FIGS. 5 and 6, in the anti-fuse 100 when a program voltage is applied to the electrode 20 and the ground voltage is applied to the semiconductor layer 40, the breakdown is induced in the gate oxide layer 60 due to the high voltages of both ends thereof.

If the gate oxide layer 60 is broken down, leakage current increases. In this way, in the anti-fuse 100, leakage current increases due to the changes in the characteristics of the gate metal 30 and the gate oxide layer 60 and the breakdown of the gate oxide layer 60, depending on whether the program is performed or not.

Figure 7:
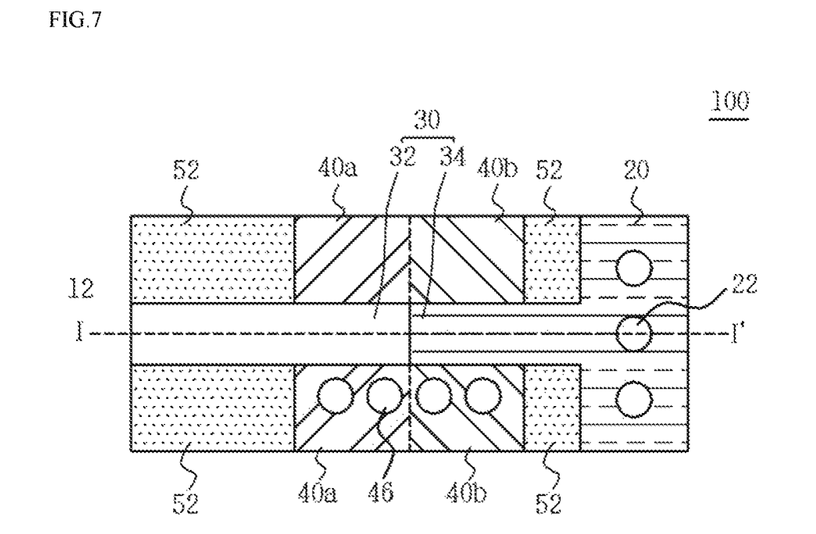
FIG. 7 is a top view to assist in the explanation of an anti-fuse for a semiconductor device in accordance with a second embodiment of the present disclosure.
Figure 8:
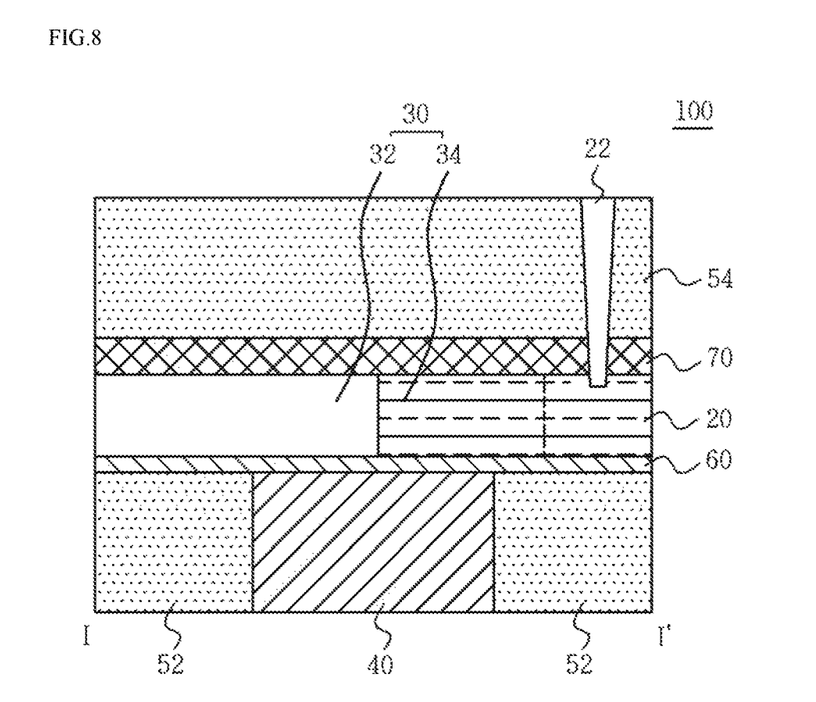
FIG. 8 is a cross-sectional view taken along the line I-I' of FIG. 7.

FIG. 7 is a top view to assist in the explanation of an anti-fuse 100 of a semiconductor device in accordance with a second embodiment of the present disclosure. FIG. 8 is a cross-sectional view taken along the line I-I' of FIG. 7. A silicon nitride layer 70 and a second oxide layer 54 shown in FIG. 8 are not shown in the top view of FIG. 7 to facilitate the understanding of the structure of the present embodiment. As shown in FIG. 8, the silicon nitride layer 70 may be formed on a gate metal 30 and an electrode 20, and the second oxide layer 54 may be formed on the silicon nitride layer 70, a semiconductor layer 40 and a first oxide layer 52.

Referring to FIGS. 7 and 8, the anti-fuse 100 of a semiconductor device includes the electrode 20, the gate metal 30, the semiconductor layer 40, the first oxide layer 52 and the gate oxide layer 60.

The gate metal 30 includes first and second gate metals 32 and 34 which are formed of different metals or may be formed of one or more different metallic materials. For instance, the first gate metal 32 may be formed of a metallic material such as Al, and the second gate metal 34 may be formed of layers of TIN, Ti, Al and AlTiO. Alternatively, the first and second gate metals 32 and 34 may be formed of layers of TiN, Ti, Al and AlTiO which have different specific gravities.

The second gate metal 34 may be formed integrally with the electrode 20. The first gate metal 32 may be formed to be contact with one end of the second gate metal 34 extending from the electrode 20 and extend in the extending direction of the second gate metal 34. The first and second gate metals 32 and 34 may overlap with each other.

The semiconductor layer 40 is formed under the gate oxide layer and under a center portion of the gate metal 30. One half of the semiconductor layer 40 may be formed into an n-type 40a, and the other half of the semiconductor layer 40 may be formed into a p-type 40b. That is, one half of the semiconductor layer 40 and the first gate metal 32 form an n-type anti-fuse, and the other half of the semiconductor layer 40 and the second gate metal 34 form a p-type anti-fuse. One or more contacts 46 for applying a ground voltage in program may be formed on the semiconductor layer 40.

The first oxide layer 52 is formed on both sides of the semiconductor layer 40 and at the same level as the semiconductor layer 40.

A gate oxide layer 60 may be formed between the bottom end of the gate metal 30 and the top ends of the semiconductor layer 40 and the first oxide layer 52 corresponding to the bottom end of the gate metal 30. The gate oxide layer 60 may be broken down due to high voltages in the program. For instance, the gate oxide layer 60 may be formed of $HfO_2$.

The silicon nitride layer 70 is formed on the gate metal 30, and the second oxide layer 54 is formed on the silicon nitride layer 70. For instance, the silicon nitride layer 70 may be formed of SiN or SiCN.

As such, the anti-fuse 100 of a semiconductor device includes the electrode 20 for applying a program voltage, the first and second gate metals 32 and 34 which are formed of different metals, the oxide layer 60 formed under the gate metal 30 and the electrode 20, the semiconductor layer 40 which is formed under the oxide layer and overlaps with a center portion of the first and second gate metals 32 and 34, and the first oxide layer 52 which is formed on both sides of the semiconductor layer 40. In the anti-fuse 100 configured as mentioned above, when a program voltage is applied to the electrode 20 and the ground voltage is applied to the semiconductor layer 40, a breakdown phenomenon is induced in the gate oxide layer 60. As a result, as a breakdown occurs, capacitance and leakage current change.

Figure 9:
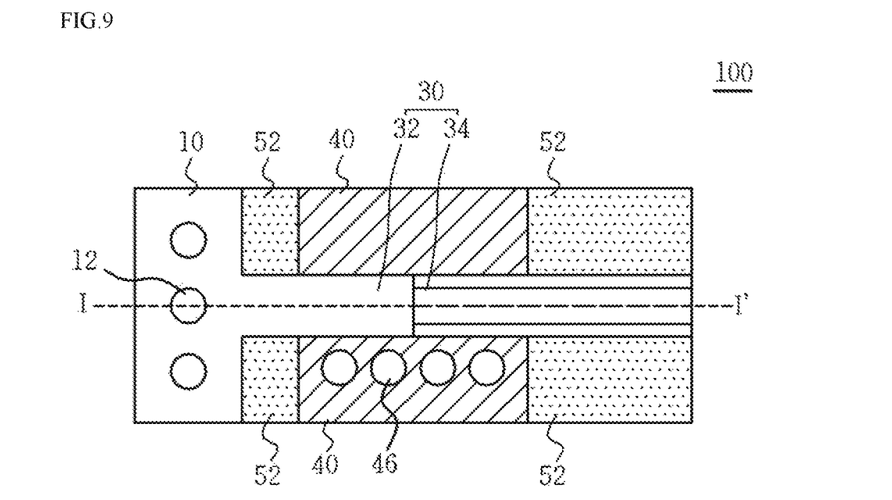
FIG. 9 is a top view to assist in the explanation of an anti-fuse for a semiconductor device in accordance with a third embodiment of the present disclosure.
Figure 10:
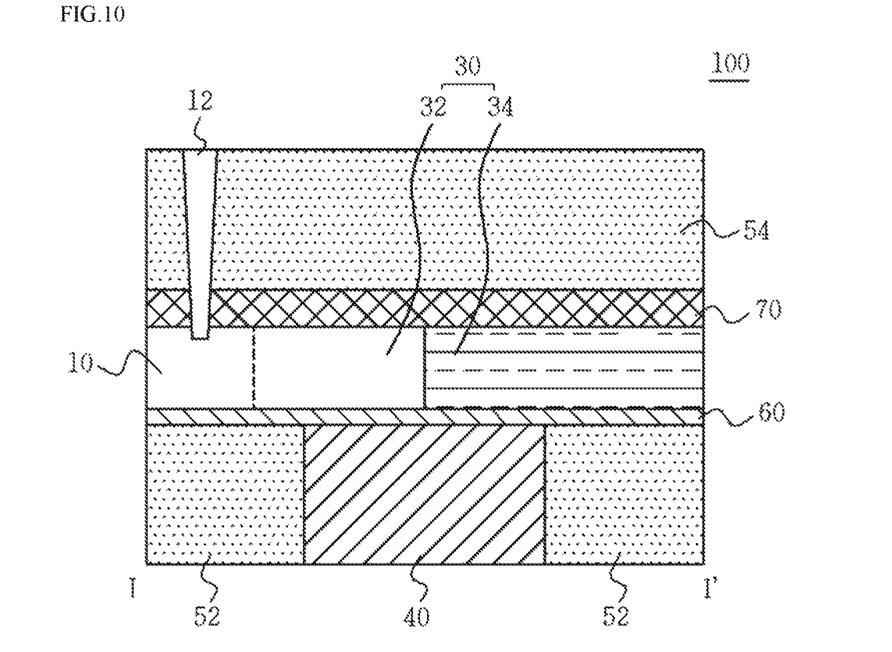
FIG. 10 is a cross-sectional view taken along the line I-I' of FIG. 9.

FIG. 9 is a top view to assist in the explanation of an anti-fuse 100 of a semiconductor device in accordance with a third embodiment of the present disclosure. FIG. 10 is a cross-sectional view taken along the line I-I' of FIG. 9. A silicon nitride layer 70 and a second oxide layer 54 shown in FIG. 10 are not shown in the top view of FIG. 9 to facilitate the understanding of the structure of the present embodiment. As shown in FIG. 10, the silicon nitride layer 70 may be formed on a gate metal 30 and an electrode 10, and the second oxide layer 54 may be formed on the silicon nitride layer 70, a semiconductor layer 40 and a first oxide layer 52.

Referring to FIGS. 9 and 10, the gate metal 30 includes first and second gate metals 32 and 34 which are formed of different metals or may be formed of one or more different metallic materials. The first gate metal 32 may be formed integrally with electrode 10.

The second gate metal 34 is brought into contact with one end of the first gate metal 32 extending from the electrode 10 and extends in the extending direction of the first gate metal 32. The first and second gate metals 32 and 34 may overlap with each other.

The semiconductor layer 40 is formed under the gate oxide layer 60 and under the center portion of the gate metal 30. One or more contacts 46 for applying a ground voltage during programming may be formed on the semiconductor layer 40. The semiconductor layer 40 may be formed in an n-type, and thus, the semiconductor layer 40 and the gate metal 30 may form an n-type anti-fuse.

The first oxide layer 52 is formed on both sides of the semiconductor layer 40 and at the same level as the semiconductor layer 40.

The gate oxide layer 60 may be formed between the bottom end of the gate metal 30 and the top ends of the semiconductor layer 40 and the first oxide layer 52 corresponding to the bottom end of the gate metal 30. The gate oxide layer 60 may be broken down due to the high voltage of both ends thereof in the program. For instance, the gate oxide layer 60 may be formed of $HfO_2$.

The silicon nitride layer 70 is formed on the gate metal 30, and the second oxide layer 54 is formed on the silicon nitride layer 70. For instance, the silicon nitride layer 70 may be formed of SiN or SiCN.

As such, the anti-fuse 100 of a semiconductor device includes the electrode 10 for applying a program voltage, the first and second gate metals 32 and 34 which are formed of different metals, the semiconductor layer 40 which is formed under the gate oxide layer 60 and overlaps with the center portion of the first and second gate metals 32 and 34, and the first oxide layer 52 which is formed from both sides of the semiconductor layer 40 to the bottoms of the electrode 10 and the second gate metal 34.

In the anti-fuse 100 of a semiconductor device configured as mentioned above, when a program voltage is applied to the electrode 10 and the ground voltage is applied to the semiconductor layer 40, the gate oxide layer 60 is broken down due to the high voltages of both ends thereof, and due to this fact, capacitance and leakage current change.

Figure 11:
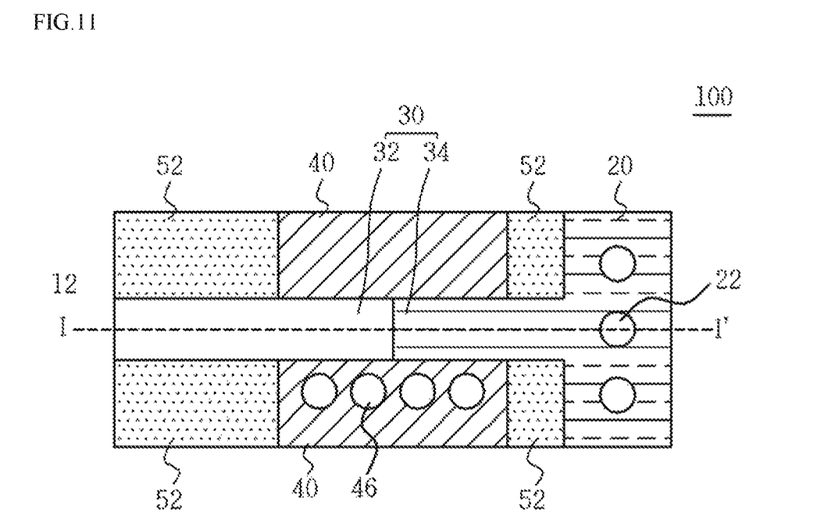
FIG. 11 is a top view to assist in the explanation of an anti-fuse for a semiconductor device in accordance with a fourth embodiment of the present disclosure.
Figure 12:
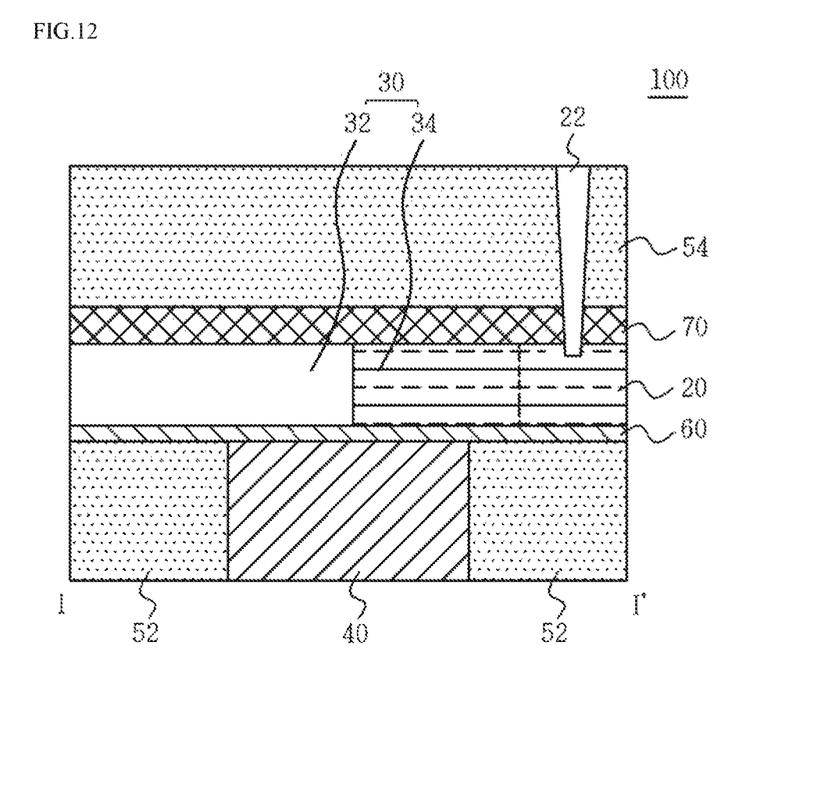
FIG. 12 is a cross-sectional view taken along the line I-I' of FIG. 11.

FIG. 11 is a top view to assist in the explanation of an anti-fuse for a semiconductor device in accordance with a fourth embodiment of the present disclosure. FIG. 12 is a cross-sectional view taken along the line I-I' of FIG. 11. A silicon nitride layer 70 and a second oxide layer 54 shown in FIG. 12 are not shown in the top view of FIG. 11 to facilitate the understanding of the structure of the present embodiment. As shown in FIG. 12, the silicon nitride layer 70 may be formed on a gate metal 30 and an electrode 20, and the second oxide layer 54 may be formed on the silicon nitride layer 70, a semiconductor layer 40, a first oxide layer 52 and a gate oxide layer 60.

Referring to FIGS. 11 and 12, the gate metal 30 includes first and second gate metals 32 and 34 which are formed of different metals or may be formed of one or more different metallic materials. The second gate metal 34 may be formed integrally with the electrode 20. The first gate metal 32 is brought into contact with one end of the second gate metal 34 extending from the electrode 20 and extends in the extending direction of the second gate metal 34. The first and second gate metals 32 and 34 may overlap with each other.

The semiconductor layer 40 is formed under the gate oxide layer 60 to overlap with the center portion of the gate metal 30, and one or more contacts 46 for applying a ground voltage in program may be formed on the semiconductor layer 40. The semiconductor layer 40 may be formed in a p-type, and thus, the semiconductor layer 40 and the gate metal 30 may form a p-type anti-fuse.

The first oxide layer 52 is formed from both sides of the semiconductor layer 40 and at the same level as the semiconductor layer 40.

The gate oxide layer 60 may be formed between the bottom end of the gate metal 30 and the top ends of the semiconductor layer 40 and the first oxide layer 52 corresponding to the bottom end of the gate metal 30. The gate oxide layer 60 may be broken down due to the high voltage of both ends thereof in the program. For instance, the gate oxide layer 60 may be formed of HfO$_2$.

The silicon nitride layer 70 is formed on the gate metal 30, and the second oxide layer 54 is formed on the silicon nitride layer 70. For instance, the silicon nitride layer 70 may be formed of SiN or SiCN.

As such, the anti-fuse 100 of a semiconductor device includes the electrode 20 for applying a program voltage, the first and second gate metals 32 and 34 which are formed of different metals, the semiconductor layer 40 which is formed under the gate oxide layer 60 to overlap with the center portion of the first and second gate metals 32 and 34, and the first oxide layer 52 which is formed on both sides of the semiconductor layer 40. In the anti-fuse 100 of a semiconductor device configured as mentioned above, when a program voltage is applied to the electrode 20 and the ground voltage is applied to the semiconductor layer 40, the gate oxide layer 60 is broken down due to the high voltages of both ends thereof, and due to this fact, capacitance and leakage current change.

Although various embodiments have been described for illustrative purposes, it will be apparent to those skilled in the art that various changes and modifications may be made without departing from the spirit and scope of the invention as defined in the following claims.

What is claimed is:

1. An anti-fuse for use in a semiconductor device, comprising:
an electrode;
a gate metal formed to extend from the electrode;
a gate oxide layer formed under the gate metal;
a semiconductor layer formed under the gate oxide layer to overlap with a center portion of the gate metal; and
a first oxide layer formed under the gate metal and the gate oxide layer and on both sides of the semiconductor layer,
wherein the gate metal and the semiconductor layer form an n-type or a p-type anti-fuse.

2. The anti-fuse for use in a semiconductor device according to claim 1, wherein the gate oxide layer is formed between a bottom end of the gate metal and a top end of the semiconductor layer corresponding to the bottom end of the gate metal.

3. The anti-fuse for use in a semiconductor device according to claim 1, further comprising one or more first contacts for applying a program voltage to the electrode, and one or more second contacts for applying a ground voltage to the semiconductor layer.

4. The anti-fuse for use in a semiconductor device according to claim 1, further comprising:
a silicon nitride layer formed over the gate metal.

5. The anti-fuse for use in a semiconductor device according to claim 4, further comprising:
a second oxide layer formed over the silicon nitride layer, the semiconductor layer and the first oxide layer.

6. An anti-fuse for use in a semiconductor device, comprising:
a gate metal formed to extend from an electrode;
a semiconductor layer formed under a center portion of the gate metal;
a gate oxide layer formed between the gate metal and the semiconductor layer; and
a first oxide layer formed under the gate metal and the gate oxide layer and on both sides of the semiconductor layer,
wherein the gate metal includes a first gate metal extending from the electrode, and a second gate metal extending by being contact with one end of the first gate metal and is formed of a metal different from the first gate metal.

7. The anti-fuse for use in a semiconductor device according to claim 6, wherein the gate oxide layer is formed between a bottom end of the gate metal and a top end of the semiconductor layer corresponding to the bottom end of the gate metal.

8. The anti-fuse for use in a semiconductor device according to claim 6, further comprising one or more first contacts for applying a program voltage to the electrode, and one or more second contacts for applying a ground voltage to the semiconductor layer.

9. The anti-fuse for use in a semiconductor device according to claim 6, wherein the gate metal and the semiconductor layer form an n-type or a p-type anti-fuse.

10. The anti-fuse for use in a semiconductor device according to claim 6, further comprising:
a silicon nitride layer formed over the gate metal.

11. The anti-fuse for use in a semiconductor device according to claim 10, further comprising:
a second oxide layer formed over the silicon nitride layer, the semiconductor layer and the first oxide layer.

12. The anti-fuse for use in a semiconductor device according to claim 6,
wherein the first gate metal and one half of the semiconductor layer form an n-type anti-fuse, and
wherein the second gate metal and the other half of the semiconductor layer form a p-type anti-fuse.

13. The anti-fuse for use in a semiconductor device according to claim 12, wherein an n-type channel and a p-type channel corresponding to the n-type anti-fuse and the p-type anti-fuse are formed in the semiconductor layer.

14. A semiconductor device comprising at least one anti-fuse, the anti-fuse comprising:
   an electrode;
   a gate metal formed to extend from the electrode;
   a gate oxide layer formed under the gate metal;
   a semiconductor layer formed under the gate oxide layer to overlap with a center portion of the gate metal; and
   a first oxide layer formed under the gate metal and the gate oxide layer and on both sides of the semiconductor layer,
   wherein the gate metal and the semiconductor layer form an n-type or a p-type anti-fuse.

15. The semiconductor device according to claim 14, wherein the gate oxide layer is formed between a bottom end of the gate metal and a top end of the semiconductor layer corresponding to the bottom end of the gate metal.

16. The semiconductor device according to claim 14, further comprising one or more first contacts for applying a program voltage to the electrode, and one or more second contacts for applying a ground voltage to the semiconductor layer.

17. The semiconductor device according to claim 14, wherein the anti-fuse further comprises:
   a silicon nitride layer formed over the gate metal.

18. The semiconductor device according to claim 17, wherein the anti-fuse further comprises:
   a second oxide layer formed over the silicon nitride layer, the semiconductor layer and the first oxide layer.

* * * * *